United States Patent
Crossland et al.

(10) Patent No.: US 10,007,045 B2
(45) Date of Patent: Jun. 26, 2018

(54) FIBER LIGHTING SYSTEMS WITH LIGHT DIFFUSING FIBERS AND METHODS OF OPERATING FIBER LIGHTING SYSTEMS WITH LIGHT DIFFUSING FIBERS

(71) Applicant: Corning Incorporated, Corning, NY (US)

(72) Inventors: Carl Edgar Crossland, Horseheads, NY (US); Peter Gerard Wigley, Corning, NY (US)

(73) Assignee: CORNING INCORPORATED, Corning, NY (US)

( * ) Notice: Subject to any disclaimer, the term of this patent is extended or adjusted under 35 U.S.C. 154(b) by 54 days.

(21) Appl. No.: 15/180,459

(22) Filed: Jun. 13, 2016

(65) Prior Publication Data

US 2016/0370528 A1 Dec. 22, 2016

Related U.S. Application Data (60) Provisional application No. 62/181,812, filed on Jun. 19, 2015.

(51) Int. Cl.
*F21V 17/02* (2006.01)
*F21V 8/00* (2006.01)
(Continued)

(52) U.S. Cl.
CPC ............ *G02B 6/0006* (2013.01); *F21V 14/04* (2013.01); *F21V 23/0407* (2013.01);
(Continued)

(58) Field of Classification Search
CPC .... G02B 6/0005; G02B 6/0006; G02B 6/001; G02B 6/4203; G02B 6/4204;
(Continued)

(56) References Cited

U.S. PATENT DOCUMENTS 5,301,090 A * 4/1994 Hed .......................... F21V 9/10
362/101
8,545,076 B2 10/2013 Bickham
(Continued)

FOREIGN PATENT DOCUMENTS

JP 2013225473 A 10/2013

OTHER PUBLICATIONS

International Search Report and Written Opinion PCT/US2016/037735 dated Sep. 15, 2016.

*Primary Examiner* — Thien M Le
*Assistant Examiner* — April Taylor
(74) *Attorney, Agent, or Firm* — Kevin L. Bray (57) ABSTRACT

Fiber lighting systems and methods of switching light are disclosed. A system includes a light source and a switching device having an input that receives light from the light source, at least one output, and a microelectromechanical mirror disposed in an optical pathway between the input and the output. The mirror is repositionable to direct light from the input into the output. The system also includes a light diffusing fiber coupled to the output that emits light along its length and an electronic control unit that directs the light source to pulse the light at a frequency of 10 Hz-500 kHz and orient the mirror for directing the light to an output. The repositioning is synchronized with the pulsing such that the mirror is at a coupled orientation during a pulse and is repositioned between pulses.

20 Claims, 3 Drawing Sheets

(51) Int. Cl.
*G02B 6/42* (2006.01)
*G02B 26/08* (2006.01)
*F21V 14/04* (2006.01)
*F21V 23/04* (2006.01)
*H01S 5/062* (2006.01)
*F21Y 115/30* (2016.01)
*F21Y 113/10* (2016.01)

(52) U.S. Cl.
CPC ............ *G02B 6/001* (2013.01); *G02B 6/4214* (2013.01); *G02B 26/0833* (2013.01); *H01S 5/06216* (2013.01); *F21Y 2113/10* (2016.08); *F21Y 2115/30* (2016.08)

(58) Field of Classification Search
CPC .............. G02B 6/4214; G02B 26/0808; G02B 26/0816; G02B 26/0833; F21V 14/04; F21V 23/0407; H01S 5/06216; F21Y 2115/30
See application file for complete search history.

(56) References Cited

U.S. PATENT DOCUMENTS

| | | |
|---|---|---|
| 8,591,087 B2 | 11/2013 | Bickham |
| 8,620,125 B2 | 12/2013 | Button |
| 8,724,942 B2 | 5/2014 | Logunov |
| 8,787,717 B2 | 7/2014 | Logunov |
| 8,897,612 B2 | 11/2014 | Logunov |
| 9,534,766 B2 * | 1/2017 | Fewkes .................. G02B 6/001 |
| 2003/0214804 A1 | 11/2003 | Irie |
| 2009/0190370 A1 | 7/2009 | Luecke et al. |
| 2010/0238374 A1 | 9/2010 | Ohse |
| 2011/0305035 A1 * | 12/2011 | Bickham .............. G02B 6/0003 362/558 |
| 2013/0088888 A1 | 4/2013 | Fewkes et al. |
| 2015/0070749 A1 * | 3/2015 | McDonald ......... G02B 26/0841 359/291 |

* cited by examiner

FIBER LIGHTING SYSTEMS WITH LIGHT DIFFUSING FIBERS AND METHODS OF OPERATING FIBER LIGHTING SYSTEMS WITH LIGHT DIFFUSING FIBERS

This application claims the benefit of priority under 35 U.S.C. § 119 of U.S. Provisional Application Ser. No. 62/181,812 filed on Jun. 19, 2015 the content of which is relied upon and incorporated herein by reference in its entirety.

BACKGROUND

Field

The present specification generally relates to fiber lighting systems and, more specifically, to fiber lighting systems with light diffusing fibers and methods for operating the same.

Technical Background

Light diffusing fibers can be used for a wide variety of purposes, such as accent lighting in vehicles, appliances, electronics, pools and spas, architecture, and the like. Because of their relatively small size and flexibility, light diffusing fibers can also be used for illumination in confined spaces that would otherwise be difficult to illuminate.

Current methods of providing a light source for light diffusing fibers can be costly, complex, and require an excessive number of components because it is necessary to pair a single light source with each light diffusing fiber.

Accordingly, a need exists for alternative methods of providing a distribution of light to light diffusing fibers without degrading the intensity of the light or requiring complex systems having many costly components that are difficult to arrange and maintain.

SUMMARY

According to one embodiment, a fiber lighting system includes a light source outputting a beam of light and a switching device. The switching device includes at least one input optically coupled to the light source such that the beam of light from the light source is received in the at least one input, at least one output, and a microelectromechanical mirror disposed in an optical pathway between the at least one input and the at least one output. The microelectromechanical mirror is repositionable to selectively and discretely direct light from the at least one input into the at least one output. The system also includes at least one light diffusing fiber optically coupled to the at least one output such that, when light is emitted from the at least one output, the at least one light diffusing fiber emits light along a length of the at least one light diffusing fiber and an electronic control unit communicatively coupled to the light source and the switching device, the electronic control unit having a processing device and a non-transitory, processor-readable storage medium having one or more processor readable and executable instructions that, when executed, cause the processing device to direct the light source to pulse the beam of light at a pulse frequency of about 10 Hz to about 5000 Hz and orient the microelectromechanical mirror to at least one of a plurality of coupled orientations such that the beam of light is directed to the at least one output, wherein the repositioning is synchronized with the pulsing such that the microelectromechanical mirror is at a coupled orientation during a pulse of the beam of light and is repositioned between pulses of the beam of light.

In another embodiment, a method of switching light between a plurality of light diffusing fibers includes directing a light source to pulse a beam of light at a pulse frequency of about 10 Hz to about 5000 Hz towards an input of a switching device such that the beam of light is received in the input and directing a microelectromechanical mirror in the switching device to reposition to at least one of a plurality of coupled orientations such that the beam of light is directed to an individual one of a plurality of outputs of the switching device and diffuses through an individual one of the plurality of light diffusing fibers optically connected to the individual one of the plurality of outputs. The repositioning is synchronized with the pulsing such that the microelectromechanical mirror is at a coupled orientation during a pulse of the beam of light and is repositioned between pulses of the beam of light.

In another embodiment, a fiber lighting system includes a semiconductor laser device outputting a beam of light and a switching device. The switching device includes at least one input optically coupled to the semiconductor laser device such that the beam of light from the semiconductor laser device is received in the at least one input, a plurality of outputs, and a microelectromechanical mirror disposed in an optical pathway between the at least one input and the plurality of outputs. The microelectromechanical mirror is repositionable to selectively and discretely direct light from the at least one input into individual ones of the plurality of outputs. The switching device further includes at least one light diffusing fiber optically coupled to each of the plurality of outputs such that, when light is emitted from the plurality of outputs, the light diffusing fiber emits light along a length of the at least one light diffusing fiber and an electronic control unit communicatively coupled to the semiconductor laser device and the switching device. The electronic control unit includes a processing device and a non-transitory, processor-readable storage medium comprising one or more processor readable and executable instructions that, when executed, cause the processing device to direct the semiconductor laser device to pulse the beam of light at a pulse frequency of about 10 Hz to about 500 kHz and orient the microelectromechanical mirror to at least one of a plurality of coupled orientations such that the beam of light is directed to an individual one of the plurality of outputs. The repositioning is synchronized with the pulsing such that the microelectromechanical mirror is at a coupled orientation during a pulse of the beam of light and is repositioned between pulses of the beam of light in a period of about 0.2 ms to about 1000 ms.

Additional features and advantages of the fiber lighting systems and methods for switching between light diffusing fibers described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Figure 1:
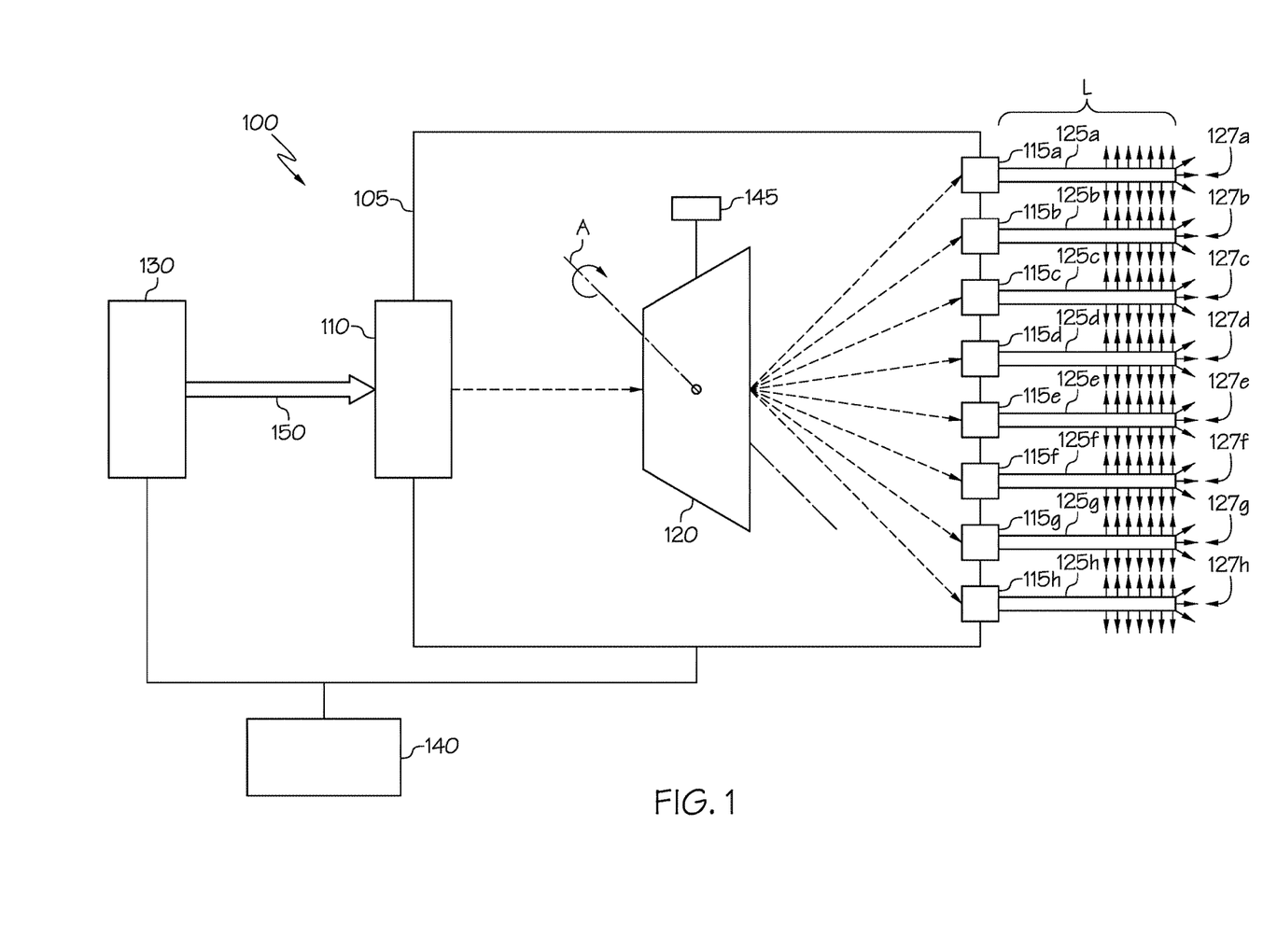
FIG. 1 schematically depicts a block diagram of an illustrative fiber lighting system according to at least one embodiment shown and described herein.

Reference will now be made in detail to various embodiments of fiber lighting systems with light diffusing fibers and methods for operating fiber lighting systems with light diffusing fibers, examples of which are illustrated in the accompanying drawings. Whenever possible, the same reference numerals will be used throughout the drawings to refer to the same or like parts. One embodiment of a fiber lighting system is shown in FIG. 1, and is designated generally throughout by the reference numeral 100. The fiber lighting system 100 generally comprises a light source 130, a switching device 105 having at least one input 110 optically coupled to the light source, at least one output 115a-h, a microelectromechanical mirror 120, at least one light diffusing fiber 125a-h optically coupled to the at least one output 115a-h, and an electronic control unit 140 communicatively coupled to the light source 130 and the switching device 105. Embodiments of fiber lighting systems with light diffusing fibers and methods of operating the same will be described in further detail herein with specific reference to the appended drawings.

Previous attempts to solve issues relating to providing light to light diffusing fibers utilized passive optical splitters that split a beam of light from a single source across a plurality of light diffusing fibers. However, this configuration decreases the intensity of the light in each light diffusing fiber and prevents uniform lighting across all light diffusing fibers. In addition, the light beams must be precisely aligned with the optical splitter and the light diffusing fibers to ensure appropriate distribution. Moreover, use of light emitting diodes (LEDs) with Lambertian light distributions limits the amount of light that can be coupled into each light diffusing fiber.

The fiber lighting systems described herein are generally arranged such that a microelectromechanical mirror switches an incident light beam from a single pulsed light source amongst a plurality of outputs to which one or more light diffusing fibers are optically coupled. The microelectromechanical mirror is capable of reorienting at a speed that allows it to reposition to at least one of a plurality of coupled orientations between pulses of light such that substantially all light incident on the mirror is redirected to and coupled into one of the light diffusing fibers connected to one of the plurality of outputs. In addition, the repositioning of the microelectromechanical mirror and the pulses from the light source may be synchronized such that, when viewed by the unaided human eye, the brain integrates each of the light pulses directed into each of the plurality of light diffusing fibers, giving the appearance that the light diffusing fibers are continuously and uniformly illuminated along their respective lengths. The light may also be controlled by the microelectromechanical mirror and/or the light source to statically or dynamically switch the light between light diffusing fibers.

As embodied herein and depicted in FIG. 1, the fiber lighting system 100 may generally include a light source 130, a switching device 105, at least one light diffusing fiber 125a-h (collectively, 125), and an electronic control unit 140. As will be described in greater detail herein, the various components of the fiber lighting system 100 may be arranged such that the switching device 105 receives light from the light source 130 and redirects the light to the light diffusing fibers 125. The light source 130 and switching device 105 are communicatively coupled to the electronic control unit 140 which controls the emission of light by the light source 130 and the switching of the switching device 105 between the discrete outputs.

In the embodiments described herein, the light source 130 may include at least one device that outputs at least one beam 150 of electromagnetic radiation. In some embodiments, the light source 130 may be a light emitting device having a gain medium that can be pumped electrically or optically to produce a desired output beam of light. Illustrative gain media may include, but are not limited to, Nd:YAG (neodymium-doped yttrium aluminum garnet), Yb:YAG (ytterbium-doped yttrium aluminum garnet), Yb:glass (ytterbium-doped glass), Er:YAG (erbium-doped yttrium aluminum garnet), and/or the like.

The at least one beam 150 of electromagnetic radiation can be a beam 150 having any wavelength of light. In some embodiments, the beam 150 may have a wavelength within the spectrum of visible light. That is, the light source 130 emits electromagnetic radiation at a wavelength that is generally visible to the unaided human eye, such as electromagnetic radiation that has a wavelength from about 390 nanometers (nm) to about 700 nm. In other embodiments, the beam 150 may have a wavelength that is not within the spectrum of visible light, such as ultraviolet (UV) light and infrared (IR) light. That is, the light source 130 emits electromagnetic radiation at a wavelength that is generally not visible to the unaided human eye, such as electromagnetic radiation that has a wavelength from about 200 nm to about 2400 nm.

The light source 130 may emit the beam 150 continuously (unpulsed) or may pulse the beam 150 of light. In some embodiments, the beam 150 may be pulsed at a specific frequency, such as, for example, when the output of the light source 130 is controlled by the electronic control unit 140. The pulses of light emitted by the light source 130 may generally be measured by a pulse frequency at which the light source 130 activates (switches on), deactivates (switches off), and reactivates (switches on) the emission of light. In the embodiments described herein, the pulse frequency of the light source 130 includes any frequency or range of frequencies at which pulses of light occur such that individual pulses are not discernible by the unaided human eye (i.e., the pulse frequency of the light source 130 is greater than 1/x, where x is the integration time of the human eye (~0.1 seconds)). That is, the light source 130 is operated at pulse frequencies that are sufficiently high such that a human observer is unable to discern that the light source (or at least the beam 150 of the light source) is being switched on and off due to the slower integration time of the human eye and persistence of vision. Illustrative pulse frequencies may include, but are not limited to, from about 10 Hz to about 500 kHz, including about 10 Hz, about 50 Hz, about 100 Hz, about 500 Hz, about 1 kHz, about 2 kHz, about 3 kHz, about 4 kHz, about 5 kHz, about 10 kHz, about 50 kHz, about 100 kHz, about 200 kHz, about 300 kHz, about 400 kHz, about 500 kHz, or any value or range between any two of these values (including endpoints). Other illustrative frequencies may include, but are not limited to, from about 10 Hz to about 100 Hz, from about 100 Hz to about 250 Hz, from about 250 Hz to about 500 Hz, from about 500 Hz to about 1000 Hz, from about 1000 Hz to about 1500 Hz, from about 1500 Hz to about 2000 Hz, from about 2000 Hz to about 2500 Hz, from about 2500 Hz to about 3000 Hz, from about 3000 Hz to about 3500 Hz, from about 3500 Hz to about 4000 Hz, from about 4000 Hz to about 4500 Hz, from about 4500 Hz to about 5000 Hz, or any value or range between any two of these values (including endpoints). In some embodiments the pulse frequency may be, for example, from about 100 Hz to about 1 kHz. In some embodiments, to avoid the perception of flicker, the pulse frequency may be from about 1 kHz to about 2 kHz.

In some embodiments, the light source 130 may be an RGB laser device, such as, for example, an RGB semiconductor laser. Such a device may output the beam 150 at any color by combining individual light streams, each emitted from a different laser diode, to produce an output beam 150 having a desired wavelength of visible light. For example, the device may include 3 laser diodes: a red laser diode that emits light at about 620 nm to about 750 nm, a green laser diode that emits light at about 495 nm to about 570 nm, and a blue laser diode that emits light at about 450 nm to about 495 nm. Various combinations of the light beams emitted from the three diodes generates a light beam 150 having a desired color, which beam 150 is subsequently emitted by the light source 130. The color of the light that is outputted may be controlled, for example, by the electronic control unit 140. That is, as described in greater detail herein, the electronic control unit 140 may independently operate each of the diodes in the RGB laser to output visible light at any one of a plurality of wavelengths. Moreover, the electronic control unit 140 may change the wavelength of the outputted visible light at any time, thereby allowing the electronic control unit 140 to direct the light source 130 to output a first pulse in a first color, a second pulse in a second color, and so on. Accordingly, it should be understood that when the light source 130 is an RGB laser device, a single light source 130 may be used to output different wavelengths of light at the at least one output 115.

In some other embodiments, the light source 130 may be a single wavelength laser device which outputs a beam 150 at a single wavelength of light. In a nonlimiting example, the single wavelength laser device may be a laser diode that outputs the beam 150 at any wavelength. In a particular example, the single wavelength laser device may be a laser diode that outputs the beam 150 at a wavelength in the visible spectrum. That is, the single wavelength laser device may output light at a particular wavelength from about 380 nm to about 750 nm, including about 380 nm, about 400 nm, about 450 nm, about 500 nm, about 550 nm, about 600 nm, about 650 nm, about 700 nm, about 750 nm, or any value or range between any two of these values (including endpoints). In some embodiments, the single wavelength laser device may output the beam 150 at a particular wavelength of from about 380 nm to about 450 nm, from about 450 nm to about 495 nm, from about 495 nm to about 570 nm, from about 570 nm to about 590 nm, from about 590 nm to about 620 nm, or from about 620 nm to about 750 nm, or any value or range between any two of these values (including endpoints).

In some embodiments, the light source 130 may be a semiconductor laser device. As used herein, the phrase "semiconductor laser device" means any laser device having a semiconductor gain medium that can be pumped electrically or optically to produce a desired output beam of light. Illustrative gain media include, but are not limited to, GaAs (gallium arsenide), AlGaAs (aluminum gallium arsenide), GaP (gallium phosphide), InGaP (indium gallium phosphide), GaN (gallium nitride), InGaAs (indium gallium arsenide), GaInNAs (indium gallium arsenide nitride), InP (indium phosphide), GaInP (gallium indium phosphide), and/or the like. Examples of semiconductor laser devices may include, but are not limited to, a Distributed Feedback (DFB) laser and a Distributed Bragg Reflector (DBR) laser. In some embodiments, use of a semiconductor laser device as the light source 130 may be desirable, as semiconductor laser devices are generally known to be capable of pulsing the beam 150 at a pulse frequency that is faster than what is generally discernible by the average human observer (i.e., an average human would not recognize that the beam 150 is continuously turned on and off). Moreover, semiconductor laser devices are readily available and can be easily controlled to alter the various properties of the light emitted therefrom, such as via electronic control unit 140, as described in greater detail herein. However, it should be understood that other types of light sources are contemplated and possible.

In some embodiments, the light source 130 may include a plurality of tributary lasers that emit light to a single trunk input, such as a transmission fiber or the like, that is optically coupled to the at least one input 110. Such an arrangement may be used, for example, to independently modulate the tributaries to form a beam 150 of light with specific properties. In some embodiments, the electronic control unit 140 may control various properties of the tributary streams. For example, the tributary lasers may each output different wavelengths and/or intensities of light such that, when the beams of light from each of the tributary lasers are combined into a single trunk input, the wavelength (i.e., the color) of the combined beam 150 is different than each of the tributary lasers, similar to that of the RGB laser device described herein above. Further, the electronic control unit 140 may also be used to control the intensity of the light beams emitted from the tributary lasers and thereby control an intensity of the beam 150 emitted from the single trunk input and directed towards the at least one input 110 of the switching device 105. By controlling the wavelength and/or intensity of each tributary laser, a single light source 130 can be utilized to provide beams with a broad spectrum of wavelengths and/or intensities to the switching device 105, thereby giving the appearance that many different light sources are coupled to the outputs 115 of the switching device 105.

While a single light source 130 is generally described herein, it should be understood that a plurality of light sources 130 (i.e., a plurality of semiconductor laser devices, a plurality of RGB laser devices, and/or the like) may be coupled into the switching device 105. That is, the plurality of light sources 130 may each independently project a beam of light into an input 110 of the switching device 105. In some embodiments, the plurality of light sources 130 may be coupled into a single input 110 of the switching device 105 while in other embodiments the plurality of light sources 130 may each be coupled in to a separate input of the switching device 105. Accordingly, it should be understood that, in some embodiments, the switching device 105 may include a plurality of inputs.

Similarly, while a plurality of outputs 115 are generally described herein, it should be understood that the switching device 105 may incorporate a single output 115 without departing from the scope of the present disclosure. Such an embodiment may be practicable, for example, in instances where the switching device 105 directs differing light beams 150 from a plurality of light sources 130 so as to change the properties of the light diffused from the one or more light diffusing fibers 125 connected to the output 115.

Still referring to FIG. 1, in some embodiments, the switching device 105 may be a photonic microelectromechanical system (MEMS) optical switch. In particular embodiments, the switching device 105 may be a M×N photonic MEMS optical switch where "M" is the number of inputs and "N" is the number of outputs. Thus, the switching device 105 may generally include at least one input 110, at least one output 115a-h (collectively, 115) and a microelectromechanical mirror 120. In addition, while not depicted herein, the switching device 105 may include a plurality of inputs 110. When the switching device 105 includes a plurality of inputs 110 and/or a plurality of outputs 115, the inputs 110 and/or outputs 115 may be arranged in a linear array or may be arranged in bundles. An illustrative commercial switching device may include, but is not limited to, a MEMS Optical Switch manufactured by Adamant Co., Ltd. (Tokyo, Japan).

The at least one input 110 may be optically coupled to the light source 130 such that the beam 150 emitted by the light source 130 is received in the input 110. In some embodiments, the light source 130 may be physically coupled to the at least one input 110 of the switching device 105. For example, in one embodiment the light source 130 may be directly coupled to the switching device 105 such that the beam 150 of the light source 130 is aligned with the input 110 of the switching device 105. In another embodiment, the beam 150 of the light source 130 may be directly coupled into the input 110 of the switching device with a transmission optical fiber attached between the light source 130 and the input 110 of the switching device. In other embodiments, the optical coupling between the light source 130 and the at least one input 110 may not need a physical coupling and, instead, the beam 150 of the light source 130 is proximity coupled into the input 110 of the switching device 105. In this embodiment, the light source 130 may be positioned at a distance from the at least one input 110 such that the beam emitted therefrom is aligned with the at least one input 110.

The microelectromechanical mirror 120, which may also be referred to as a micromirror, may generally be any MEMS device, or portion thereof, that is configured to alter a direction, change a focus, and/or redistribute electromagnetic radiation, including, but not limited to, visible light. In the embodiments described herein, the microelectromechanical mirror 120 of the switching device 105 is utilized to redirect light received from the input 110 to at least one output 115 (e.g., individual ones of a plurality of outputs 115) by controlling the angular orientation of the microelectromechanical mirror 120 about its axis A of rotation. It will be readily apparent that while only a single axis A of rotation is depicted, the microelectromechanical mirror 120 may have a plurality of axes of rotation. For example, the microelectromechanical mirror 120 may move in one dimension (defining a plane) or may move in a plurality of dimensions. While the present disclosure refers only to a single microelectromechanical mirror 120, it will be readily apparent that a plurality of microelectromechanical mirrors 120 may be used without departing from the scope of the present disclosure. For example, the switching device 105 may incorporate an array of microelectromechanical mirrors 120. In another example, the switching device 105 may incorporate a plurality of microelectromechanical mirrors 120, where each mirror in the plurality of microelectromechanical mirrors 120 redirects light from at least one of a plurality of inputs 110 to at least one of a plurality of outputs 115 or to a single output 115.

In some embodiments, the microelectromechanical mirror 120 may include one or more reflective surfaces, particularly reflective surfaces generally recognized for reflecting the beam 150 of light. Thus, the microelectromechanical mirror 120 may include one or more reflective surfaces and/or coatings that are suitable for reflecting the particular wavelength of the beam 150 of light. For example, a beam 150 that is outputted by the light source 130 at a wavelength within the UV spectrum would be reflected by the microelectromechanical mirror 120 having a surface and/or coating that is suitable for reflecting UV wavelengths.

Illustrative examples of the microelectromechanical mirror 120 may include, but are not limited to, a reflective panel that is hinged to a reference base and electrostatically rotates about the hinge, a gimbal that is mounted on a first hinge connected to a reference surface and a mirror that is mounted on a second hinge connected to the gimbal, and a mirror that is mounted on a central post anchored to a locking pin joint that is carved into a reference surface. However, it should be understood that other types of microelectromechanical mirrors are contemplated and possible.

The small size and relatively low mass of the microelectromechanical mirror 120 facilitates relatively fast switching between discrete orientations of the microelectromechanical mirror 120 about its axis A of rotation. This fast switching permits the movement and reorientation of the microelectromechanical mirror 120 to be synchronized with the pulsed operation of the light source 130 such that movement and reorientation of the microelectromechanical mirror 120 can be accomplished between consecutive pulses of the beam 150 of the light source 130, thereby maximizing the amount of light passed to the outputs 115 of the switching device 105 and minimizing the amount of light which is "spilled" into the interior of the switching device 105 as the microelectromechanical mirror 120 is repositioned.

In the embodiments described herein, the microelectromechanical mirror 120 is positioned within the switching device 105 along an optical pathway between the input 110 of the switching device 105 and the outputs 115 of the switching device 105. This permits the beam 150 of the light source 130 to be coupled into the input 110 of the switching device 105 such that the beam is incident on the microelectromechanical mirror 120. Electronic circuitry associated with the microelectromechanical mirror 120 may be utilized to control (i.e., "drive") the mirror to a specified orientation about at least one axis A of rotation, thereby facilitating "switching" between one of the plurality of outputs 115 of the switching device. This switching effectively redirects the beam of the light source 130 into one of the plurality of outputs 115 based on the orientation of the microelectromechanical mirror 120 about its axis A of rotation.

The ability of the microelectromechanical mirror 120 to be actively repositioned about its axis A of rotation, such as through the application of a control signal from the electronic control unit 140, allows the microelectromechanical mirror 120 to re-direct the light from the at least one input 110 into individual ones of the plurality of outputs 115a-h. Direction of the light between the at least one input 110 and the individual ones of the plurality of outputs 115a-h (i.e., the coupling of the beam 150 of the light source 130 from the input 110 of the switching device 105 to the output of the switching device 105) may be completed selectively and discretely. That is, the microelectromechanical mirror 120 may selectively re-direct the full intensity of the light beam from the at least one input 110 to a particular one of the plurality of outputs 115 (for example, a first output 115a or a second output 115b) by repositioning to a corresponding coupling orientation between pulses of the beam 150 such that the light travels from the at least one input 110 to the particular one of the plurality of outputs 115 via the microelectromechanical mirror 120.

In addition, the microelectromechanical mirror 120 may discretely direct the light from the at least one input 110 to a particular one of the plurality of outputs 115 (for example, a first output 115a or a second output 115b) at a particular moment such that the full intensity of the beam 150 is only redirected to that particular one of the plurality of outputs 115 at that particular moment (i.e., light is not simultaneously redirected to any of the other outputs 115). Such a discrete direction of the light ensures that the particular one of the plurality of light diffusing fibers 125 connected to the particular one of the outputs 115 receives the full intensity of the beam 150 such that little to no light is lost and the intensity of the beam 150 is not degraded by splitting the beam 150 into two or more "sub-beams" as in the case of conventional beam splitters.

In the embodiments described herein, positioning and repositioning of the microelectromechanical mirror 120 may be controlled by the electronic control unit 140. Specifically, the electronic control unit 140 may transmit control signals to the microelectromechanical mirror 120 that direct the microelectromechanical mirror 120 to move to a particular orientation about its axis A of rotation, as described in further detail herein. Moreover, control of the microelectromechanical mirror 120 with the electronic control unit 140 ensures that the microelectromechanical mirror 120 is synchronized with the pulses emitted by the light source 130 such that the microelectromechanical mirror 120 only moves between each pulse of light, thereby avoiding any loss of light, as described hereinabove. In some embodiments, the electronic control unit 140 may send control signals to a drive unit 145 of the microelectromechanical mirror 120 that controls the orientation of the microelectromechanical mirror 120 about its axis A of rotation. In some other embodiments, the drive unit 145 may be integral with the electronic control unit 140. The drive unit 145 may generally be any electronic circuit suitable for moving the microelectromechanical mirror 120 or actuating components of the microelectromechanical mirror 120 to cause rotation of the microelectromechanical mirror 120 about its axis A of rotation. In some embodiments, the electronic control unit 140 may move the microelectromechanical mirror 120 at a constant cycle between a plurality of coupled orientations where the beam 150 of the light source 130 incident on the input 110 of the switching device 105 is optically coupled to a different output at each discrete coupled orientation. Thus, using the embodiment shown in FIG. 1 as an example, the drive unit 145 may move the microelectromechanical mirror 120 from a first coupled orientation that directs the light from the at least one input 110 to a first output 115a, to a second coupled orientation that directs the light from the at least one input 110 to a second output 115b, and so forth, until the microelectromechanical mirror 120 reaches an eighth coupled orientation that directs the light from the at least one input 110 to an eighth output 115h before returning to the first coupled orientation and completing the cycle again.

As previously described herein, the microelectromechanical mirror 120 may be repositioned about its axis A of rotation to direct the light beam between the at least one input 110 and a particular one of the plurality of outputs 115. Thus, the microelectromechanical mirror 120 may be repositioned such that the beam 150 is incident on any one of the plurality of outputs 115 at any particular moment based on the orientation of the microelectromechanical mirror 120 about its axis A of rotation. Specifically, the microelectromechanical mirror 120 may be repositioned to a number of coupled orientations that corresponds to a number of outputs 115 of the switching device 105. For example, FIG. 1 depicts a switching device 105 with 8 outputs. The electronic control unit 140 may be programmed to orient the microelectromechanical mirror 120 to at least 8 different coupled orientations where the beam 150 incident on the input 110 of the switching device 105 is optically coupled to an individual one of the plurality of outputs 115. In some embodiments, the angular orientation of the microelectromechanical mirror 120 for each coupled orientation may be programmed into a memory portion of the electronic control unit 140 (as described herein) such that the electronic control unit 140 can direct the microelectromechanical mirror 120 to move to the particular angular orientation to ensure the microelectromechanical mirror 120 directs the light to one of the outputs 115a-h corresponding to the particular angular orientation. While the examples above describe moving the microelectromechanical mirror 120 to consecutive coupled orientations, it should be understood that the electronic control unit can be programmed to orient the microelectromechanical mirror 120 to any of the coupled orientations in any sequence and that certain coupled orientations may be skipped during a particular illumination cycle to achieve a desired lighting effect.

In some embodiments, the microelectromechanical mirror 120 may be repositionable such that it selectively illuminates or de-illuminates each of the plurality of outputs 115 (and thus the at least one light diffusing fiber 125 connected thereto). Such selective illumination and de-illumination may provide a pulsating effect of the light from the light diffusing fibers 125 to an observer of the light diffusing fibers 125.

In some embodiments, the electronic control unit 140 is programmed to adjust the angular orientation of the microelectromechanical mirror 120 between pulses from the light source 130. That is, the microelectromechanical mirror 120 is repositioned between pulses of light from the light source 130 such that substantially no light is lost due to misalignment of the microelectromechanical mirror 120 with any one of the outputs 115a-h. For example, to ensure that the angular orientation of the microelectromechanical mirror 120 is adjusted between pulses of the light source 130, the angular orientation of the microelectromechanical mirror 120 may be adjusted at a predetermined regular period. Such a period is generally defined by Equation (1):

$$t < \frac{1}{f} \quad (1)$$

where f is the pulse frequency of the pulses of light emitted by the light source 130. As shown in Equation (1), the period in which the microelectromechanical mirror 120 moves between coupled orientations is less than the amount of time between consecutive pulses of the light source 130, thereby ensuring that the microelectromechanical mirror 120 is appropriately positioned in a coupled orientation before the light source 130 emits prior to the next consecutive pulse of the light source 130. Thus, it should be understood that a modulation period of the microelectromechanical mirror 120 is less than the pulse frequency of the light source 130. Illustrative periods may include, but are not limited to, about 0.2 ms to about 1000 ms, including about 0.2 ms, about 0.3 ms, about 0.4 ms, about 0.5 ms, about 0.6 ms, about 0.7 ms, about 0.8 ms, about 0.9 ms, about 1 ms, about 5 ms, about 10 ms, about 100 ms, about 200 ms, about 300 ms, about 400 ms, about 500 ms, about 600 ms, about 700 ms, about 800 ms, about 900 ms, about 1000 ms, or any value or range between any two of these values (including endpoints).

In other embodiments, the electronic control unit 140 is programmed to adjust the angular orientation of the microelectromechanical mirror 120 irrespective of the pulses from the light source 130. That is, the microelectromechanical mirror 120 is repositioned at intervals that may or may not correspond to the pulses from the light source 130. For example, the microelectromechanical mirror 120 may move between coupled orientations in a period that is greater than the amount of time between consecutive pulses of the light source 130, thereby creating a visual effect on the beam 150 when emitted from one of the light diffusing fibers 125. Illustrative visual effects on the beam may include, but are not limited to, flicker and motion artifacts. In another example, the light source 130 may not pulse, but rather may constantly output the beam 150 of light while the microelectromechanical mirror 120 moves between the coupled orientations.

In some embodiments, the electronic control unit 140 may be programmed to control the microelectromechanical mirror 120 and/or the light source 130 to statically switch the light between the outputs 115. That is, the beam 150 may be evenly switched between the outputs 115 such that various properties of the light are consistent across every output 115 (e.g., the light has the same intensity, color, refresh rate, etc. on every output 115). In other embodiments, the electronic control unit 140 may be programmed to control the microelectromechanical mirror 120 and/or the light source 130 to dynamically switch the light between the outputs 115. That is, the beam 150 may be varied based on the particular output 115. For example, a first output 115a may receive the beam 150 at a first intensity, a first color, a first refresh rate, and/or the like, whereas a second output 115b receives the beam 150 at a second intensity, the first color, the first refresh rate, and/or the like, and a third output 115c receives the beam 150 at a third intensity, a second color, a second refresh rate, and/or the like. Thus, each output 115 (and light diffusing fiber 125 connected thereto) may appear to an observer to diffuse a different type of light with respect to the other outputs 115 (and light diffusing fibers 125 connected thereto) but in actuality, each output 115 receives light that originates from the same beam 150. Accordingly, it will be readily apparent that the present disclosure relates to both static control and dynamic control of the beam 150.

While the switching device 105 depicted in the attached figures contains eight outputs, it should be understood that the number of outputs 115 is not limited and that the switching device 105 may include greater than eight outputs or less than eight outputs. In some embodiments, the switching device 105 may include an even number of outputs 115 (e.g., 2, 4, 6, or 8 outputs) or an odd number of outputs 115 (e.g., 1, 3, 5, 7, 9, or 10 outputs). Thus, the switching device 105 may incorporate any number of outputs 115. In some embodiments, the number of outputs 115 may correspond to a number of light diffusing fibers 125 that receive light from the light source 130 (i.e., a 1:1 ratio of outputs 115 to light diffusing fibers 125). Alternatively, the number of outputs 115 may correspond to twice the number of light diffusing fibers 125 that receive light from the light source 130 (i.e., a 2:1 ratio of outputs 115 to light diffusing fibers 125). In yet other embodiments, the number of outputs 115 may correspond to a fraction of the number of light diffusing fibers 125 that receive light from the light source 130 (e.g., each output 115 has a plurality of light diffusing fibers 125 coupled thereto, such as outputs 115 to light diffusing fibers 125 in a 1:2 ratio, a 1:3 ratio, a 1:4, ratio, a 1:5 ratio, or the like). In some embodiments, a maximum number of outputs 115 may be necessary based on the speed at which the microelectromechanical mirror 120 can complete a cycle (e.g., consecutively switch between each of the outputs 115) without being perceived by an average human observer. That is, the microelectromechanical mirror 120 may switch between each coupled orientation in the cycle fast enough that the average human observer perceives each light diffusing fiber 125a-h connected to the outputs 115 as being simultaneously illuminated due to persistence of vision. Thus, each light diffusing fiber 125a-h has the appearance of being illuminated by the light source 130 at the same time while, in actuality, the light source 130 only illuminates one light diffusing fiber 125 at a time but does so in rapid succession so as to give the appearance that each light diffusing fiber 125 is continuously illuminated. If the switching device 105 incorporates too many outputs 115 (and corresponding light diffusing fibers 125), the microelectromechanical mirror 120 may not be able to complete a cycle fast enough, thereby causing an average human observer to perceive a flickering of the light from the light diffusing fibers 125. In some embodiments, the switching device 105 may incorporate about 2 to about 16 outputs 115, including 2, 3, 4, 5, 6, 7, 8, 9, 10, 11, 12, 13, 14, 15, or 16 outputs 115.

As noted above, each of the plurality of outputs 115 of the switching device 105 may be coupled to a respective light diffusing fiber 125a-h. The light diffusing fiber 125a-h may be optically coupled to a respective output 115a-h such that the light from the light source 130 is directed through the outputs 115a-h into the light diffusing fiber 125a-h. Thus, when the light is emitted from the respective output 115a-h, the coupled light diffusing fiber 125a-h emits light (as indicated by the arrows emerging from the respective light diffusing fibers 125) and is thus illuminated.

The light diffusing fibers 125 coupled to the outputs of the switching device 105 may include any type of optical fiber designed to emit light along its length. Suitable light diffusing fibers 125 may include, without limitation, the light diffusing optical fibers disclosed in U.S. Pat. Nos. 8,591,087 and 8,724,942. In some embodiments, the light diffusing fibers 125 may be glass fibers, particularly fibers having a silica glass core surrounded by a silica glass cladding and/or a polymer cladding. The silica glass core may include a plurality of scattering centers that allow light to scatter through the cladding(s). The scattering centers may generally scatter propagating light independently of the wavelength of the light. In some embodiments, the light diffusing fibers 125 may be colored light diffusing fibers (i.e., containing a pigment, dye, or the like that alters the color of the light emitted from the light source 130). In other embodiments, the light diffusing fibers 125 may be colorless or substantially colorless (i.e., diffusing light that corresponds to the color of light emitted from the light source 130). In still other embodiments, the glass or polymer cladding may include materials which fluoresce when exposed to certain wavelengths of light. Such materials may include, without limitations, phosphors or the like. A nonlimiting example of the light diffusing fibers 125 may be a glass or polymer optical fiber that is used for thin, colorful, aesthetic lighting.

Such light diffusing fibers 125 may enable decorative lighting to be designed or embedded into tight or small places where other bulky lighting elements cannot fit. The light diffusing fibers 125 are flexible, thereby allowing the fibers to curve, wrap, or contour around objects while maintaining bright and uniform light.

Figure 2:
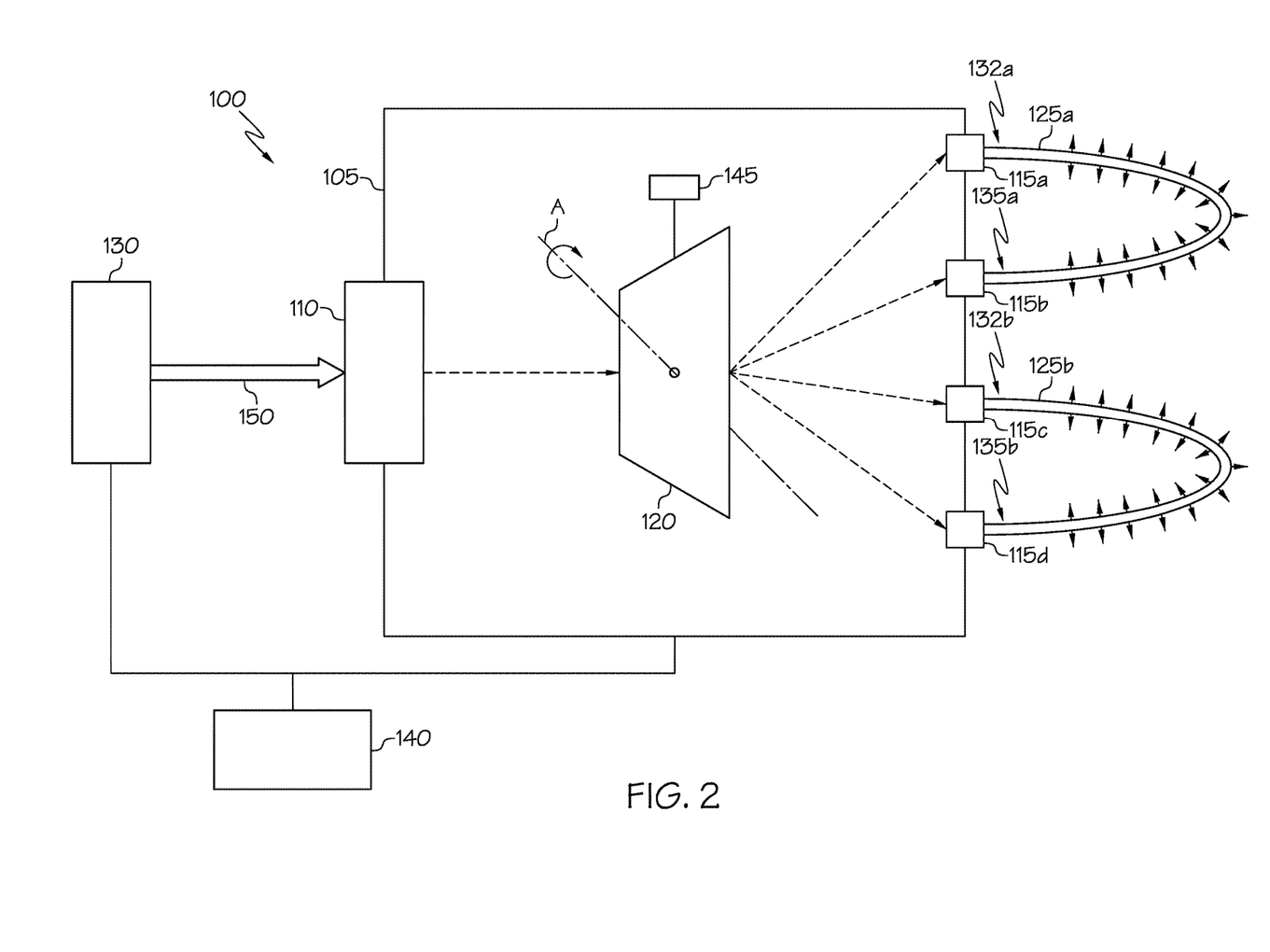
FIG. 2 schematically depicts a block diagram of an illustrative fiber lighting system according to at least one embodiment shown and described herein.

In some embodiments, each output 115a-h may be optically coupled to a single corresponding light diffusing fiber 125a-h, as depicted in FIG. 1. Thus, the light from the light source 130 may enter the light diffusing fiber 125a-h and propagate out of the light diffusing fiber 125a-h along at least a portion of its length L (as depicted by the arrows emerging from the light diffusing fibers 125). In such embodiments, more light may diffuse out of the light diffusing fiber 125a-h nearer the respective output 115a-h, thereby causing less or no light to diffuse out of the light diffusing fiber at an endpoint 127a-h located at the end of the length L of the respective light diffusing fiber 125a-h opposite the output. Thus, with longer lengths of light diffusing fiber, an observer may discern that certain portions of the light diffusing fibers 125 (e.g., portions nearer to the respective output 115a-h) are brighter and/or more vivid than other portions of the fiber further from the output. To avoid such a situation and to ensure uniform illumination along the length L of each of the light diffusing fibers, in some embodiments, both ends of the light diffusing fiber 125a-h may be coupled to different outputs of the switching device 104, as depicted in FIG. 2. Specifically, FIG. 2 depicts an arrangement whereby each light diffusing fiber 125a, 125b has a first end 132a, 132b and a second end 135a, 135b each of which are optically coupled to a respective output 115a-d on the switching device 105. Thus, as shown in FIG. 2, a first light diffusing fiber 125a may have a first end 132a optically coupled to a first output 115a and a second end 135a optically coupled to a second output 115b. Similarly, a second light diffusing fiber 125b may have a first end 132b optically coupled to a third output 115c and a second end 135b optically coupled to a fourth output 115d. In such an arrangement, the microelectromechanical mirror 120 switches between coupled orientations for each end 132a, 132b, 135a, 135b of the light diffusing fibers 125a, 125b. In addition, the electronic control unit 140 may cause the microelectromechanical mirror 120 to switch between coupled orientations to direct the light in the ends 132a, 132b, 135a, 135b of the light diffusing fibers 125a, 125b such that each of light diffusing fibers 125a, 125b are uniformly illuminated along their entire lengths.

Figure 3:
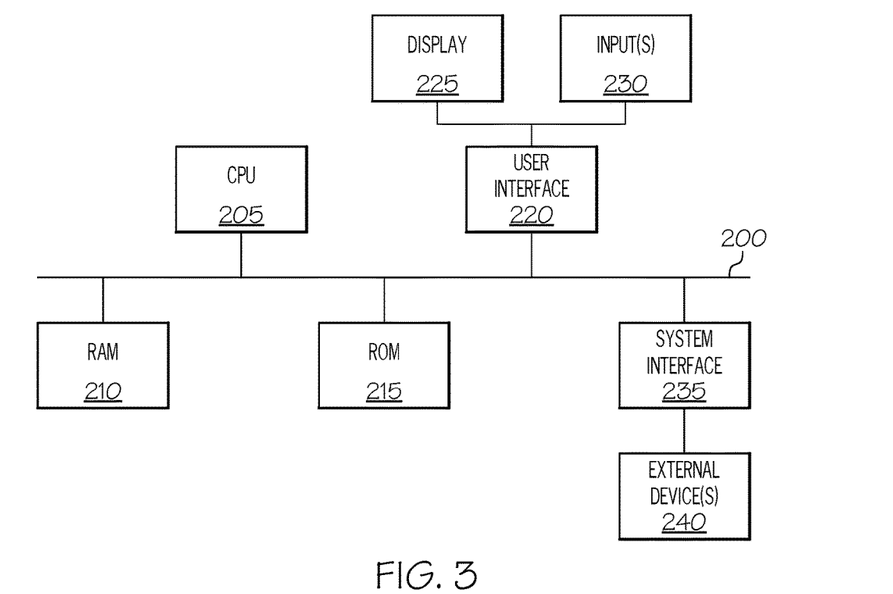
FIG. 3 schematically depicts a block diagram of illustrative control unit components according to at least one embodiment shown and described herein.

The electronic control unit 140 may generally be any control unit suitable for providing electronic control signals to one or more of the various components of the fiber lighting system 100. For example, the electronic control unit 140 may provide control signals to the light source 130 to pulse the beam 150 at a particular pulse frequency, change the color of the emitted light, change the intensity of the emitted light, and/or the like. In addition, the electronic control unit 140 may direct the microelectromechanical mirror 120 and/or the drive unit 145 to switch between coupling orientations. To effect control of the various components of the fiber lighting system 100, the electronic control unit 140 may include a plurality of hardware components. Illustrative hardware components of the electronic control unit 140 are depicted in FIG. 3. A bus 200 may interconnect the various components. A processing device, such as a computer processing unit (CPU) 205, may be the central processing unit of the electronic control unit 140 (FIG. 1), performing calculations and logic operations required to execute a program. The CPU 205, alone or in conjunction with one or more of the other elements disclosed in FIG. 3, is an illustrative processing device, computing device, processor, or combination thereof, as such terms are used within this disclosure. Memory such as read only memory (ROM) 215 and random access memory (RAM) 210 may constitute illustrative memory devices (i.e., non-transitory processor-readable storage media). Such memory 210, 215 may include one or more program instructions thereon that, when executed by the CPU 205, cause the CPU 205 to complete various processes, such as the processes described herein. Optionally, the program instructions may be stored on a tangible computer-readable medium such as a compact disc, a digital disk, flash memory, a memory card, a USB drive, an optical disc storage medium, such as a Blu-Ray™ disc, and/or other non-transitory processor-readable storage media.

An optional user interface 220 may permit information from the bus 200 to be displayed on a display 225 in audio, visual, graphic, or alphanumeric format. Moreover, the user interface 220 may also include one or more inputs 230 that allow for transmission to and receipt of data from input devices such as a keyboard, a mouse, a joystick, a touch screen, a remote control, a pointing device, a video input device, an audio input device, a haptic feedback device, and/or the like. Such a user interface 220 may be used, for example, to allow a user to adjust the pulse frequency, adjust the color emitted by the light source 130 (FIG. 1), adjust the period between coupling orientations, turn on or off coupling orientations such that only certain light diffusing fibers 125a-h receive light from the light source 130 (FIG. 1), and/or the like.

A system interface 235 may generally provide the electronic control unit 140 (FIG. 1) with an ability to interface with one or more external devices 240, particularly the one or more other portions of the fiber lighting system 100 (FIG. 1), such as, for example, the light source 130 (FIG. 1), the microelectromechanical mirror 120, the drive unit 145 (FIG. 1), external computing devices, remote servers, and/or the like. Communication with external devices 240 may occur using various communication ports (not shown). An illustrative communication port may be attached to a communications network, such as the Internet, an intranet, a local network, a direct connection, and/or the like.

Figure 4:
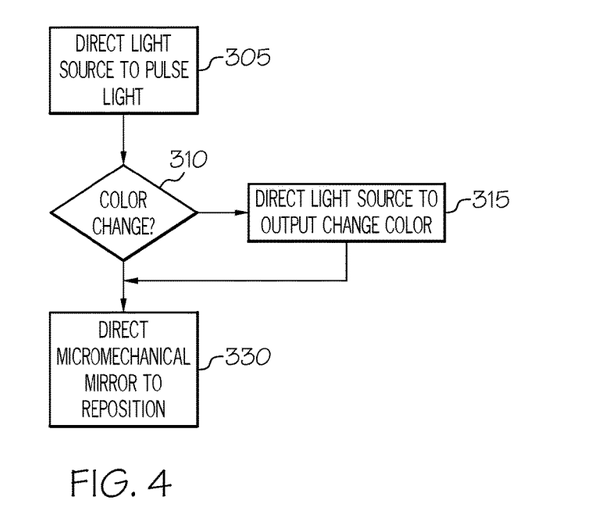
FIG. 4 schematically depicts a flow diagram of an illustrative method of switching light between a plurality of light diffusing fibers according to at least one embodiment shown and described herein.

FIG. 4 depicts a flow diagram of an illustrative method of switching light between a plurality of light diffusing fibers according to an embodiment. The method may include a step 305 of directing a light source to pulse a beam of light. The light source may be directed in step 305 to pulse the beam of light at a pulse frequency of about 10 Hz to about 500 kHz towards an input of a switching device such that the beam of light is received in the input.

The method may optionally include a step 310 of determining whether a wavelength change is necessary for the outputted light. If a wavelength change is necessary, the light source may be directed in step 315 to output a beam with the specified wavelength, such as when the light source is an RGB laser as described herein. Thus, the method includes directing the light source to output light at any one of a plurality of wavelengths.

The method may include a step 330 of directing the microelectromechanical mirror to adjust its angular orientation. The microelectromechanical mirror may be directed in step 330 to reposition to at least one of a plurality of coupled orientations such that the beam of light is directed to an individual one of a plurality of outputs of the switching device, as described in greater detail herein. Accordingly, the light may be diffused through an individual one of the plurality of light diffusing fibers optically connected to the individual one of the plurality of outputs, thereby illuminating the fiber. In addition, directing the microelectromechanical mirror to reposition may be synchronized with the pulsing of the light beam of the light source such that the microelectromechanical mirror is at a coupled orientation during a pulse of the beam of light and is repositioned between pulses of the beam of light, as described herein. In some embodiments, the directing step 330 may include directing the microelectromechanical mirror to reposition between coupled orientations in a period of about 0.2 ms to about 1000 ms. In some embodiments, directing the microelectromechanical mirror may include directing the microelectromechanical mirror such that the beam of light is directed to a light diffusing fiber optically coupled to at least one of the plurality of outputs.

It should now be understood that fiber lighting systems depicted and described herein direct a beam of light from a light source to a plurality of light diffusing fibers by rapidly switching the light between the light diffusing fibers using a microelectromechanical mirror. The microelectromechanical mirror is synchronized with the light source such that it moves between coupled orientations when the light source is switched off between pulses, thereby avoiding light loss and wasted light. In addition, the light source pulses the light at a frequency that is faster than what is perceivable by an unaided human eye, thereby giving an average observer an impression that the light is evenly distributed to each of the light diffusing fibers, when in actuality, each light diffusing fiber receives the entire redirected beam of light at a particular time.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A fiber lighting system comprising:
   a light source outputting a beam of light;
   a switching device comprising:
     at least one input optically coupled to the light source such that the beam of light from the light source is received in the at least one input;
     at least one output; and
     a microelectromechanical mirror disposed in an optical pathway between the at least one input and the at least one output, the microelectromechanical mirror being repositionable to selectively and discretely direct light from the at least one input into the at least one output;
   at least one light diffusing fiber optically coupled to the at least one output such that, when light is emitted from the at least one output, the at least one light diffusing fiber emits light along a length of the at least one light diffusing fiber; and
   an electronic control unit communicatively coupled to the light source and the switching device, the electronic control unit comprising a processing device and a non-transitory, processor-readable storage medium comprising one or more processor readable and executable instructions that, when executed, cause the processing device to:
     direct the light source to pulse the beam of light at a pulse frequency of 10 Hz to 500 kHz; and
     orient the microelectromechanical mirror to at least one of a plurality of coupled orientations such that the beam of light is directed to the at least one output, wherein the repositioning is synchronized with the pulsing such that the microelectromechanical mirror is at a coupled orientation during a pulse of the beam of light and is repositioned between pulses of the beam of light.

2. The fiber lighting system of claim 1, wherein the at least one output comprises 2 to 16 outputs.

3. The fiber lighting system of claim 1, wherein the microelectromechanical mirror moves between coupled orientations in a period of 0.2 ms to 1000 ms.

4. The fiber lighting system of claim 1, wherein the light source comprises at least one of an RGB laser device and a single wavelength laser device.

5. The fiber lighting system of claim 1, wherein:
   the light source is an RGB laser; and
   the non-transitory, processor-readable storage media further comprises one or more processor readable and executable instructions that, when executed, cause the processing device to direct the RGB laser to output the light at any one of a plurality of wavelengths.

6. The fiber lighting system of claim 1, wherein the light source is a semiconductor laser device.

7. The fiber lighting system of claim 1, wherein:
   the at least one output is a plurality of outputs; and
   the at least one light diffusing fiber comprises a first end optically coupled to a first output of the plurality of outputs and a second end optically coupled to a second output of the plurality of outputs.

8. The fiber lighting system of claim 1, wherein:
   the at least one output is a plurality of outputs; and
   the at least one light diffusing fiber is coupled to any of the plurality of outputs.

9. The fiber lighting system of claim 1, wherein:
   the at least one output is a plurality of outputs;
   the at least one light diffusing fiber is a plurality of light diffusing fibers; and
   each of the plurality of light diffusing fibers is optically coupled to one of the plurality of outputs.

10. A method of switching light between a plurality of light diffusing fibers, the method comprising:
    directing a light source to pulse a beam of light at a pulse frequency of 10 Hz to 500 kHz towards an input of a switching device such that the beam of light is received in the input; and
    directing a microelectromechanical mirror in the switching device to reposition to at least one of a plurality of coupled orientations such that the beam of light is directed to an individual one of a plurality of outputs of the switching device and diffuses through an individual one of the plurality of light diffusing fibers optically connected to the individual one of the plurality of outputs, wherein the repositioning is synchronized with the pulsing such that the microelectromechanical mirror is at a coupled orientation during a pulse of the beam of light and is repositioned between pulses of the beam of light.

11. The method of claim 10, wherein directing the microelectromechanical mirror to reposition comprises directing the microelectromechanical mirror to reposition between coupled orientations in a period of 0.2 ms to 1000 ms.

12. The method of claim 10, wherein directing the microelectromechanical mirror comprises directing the microelectromechanical mirror to reposition to at least one of the plurality of coupled orientations such that the beam of light is directed to a light diffusing fiber optically coupled to at least one of the plurality of outputs.

13. The method of claim 10, further comprising:
directing the light source to output the beam of light at any one of a plurality of wavelengths in a visible spectrum.

14. The method of claim 10, further comprising:
directing the microelectromechanical mirror to switch between a first coupled orientation that directs the beam of light to a first output optically connected to a first end of the individual one of the plurality of light diffusing fibers and a second coupled orientation that directs the beam of light to a second output optically connected to a second end of the individual one of the plurality of light diffusing fibers.

15. A fiber lighting system comprising:
a semiconductor laser device outputting a beam of light;
a switching device comprising:
  at least one input optically coupled to the semiconductor laser device such that the beam of light from the semiconductor laser device is received in the at least one input;
  a plurality of outputs; and
  a microelectromechanical mirror disposed in an optical pathway between the at least one input and the plurality of outputs, the microelectromechanical mirror being repositionable to selectively and discretely direct light from the at least one input into individual ones of the plurality of outputs;
at least one light diffusing fiber optically coupled to each of the plurality of outputs such that, when light is emitted from the plurality of outputs, the light diffusing fiber emits light along a length of the at least one light diffusing fiber; and
an electronic control unit communicatively coupled to the semiconductor laser device and the switching device, the electronic control unit comprising a processing device and a non-transitory, processor-readable storage medium comprising one or more processor readable and executable instructions that, when executed, cause the processing device to:
  direct the semiconductor laser device to pulse the beam of light at a pulse frequency of 10 Hz to 500 kHz; and
  orient the microelectromechanical mirror to at least one of a plurality of coupled orientations such that the beam of light is directed to an individual one of the plurality of outputs, wherein the repositioning is synchronized with the pulsing such that the microelectromechanical mirror is at a coupled orientation during a pulse of the beam of light and is repositioned between pulses of the beam of light in a period of 0.2 ms to 1000 ms.

16. The fiber lighting system of claim 15, wherein the plurality of outputs comprise 2 to 16 outputs.

17. The fiber lighting system of claim 15, wherein the semiconductor laser is an RGB semiconductor laser.

18. The fiber lighting system of claim 15, wherein the non-transitory, processor-readable storage media further comprises one or more processor readable and executable instructions that, when executed, cause the processing device to:
  direct the RGB semiconductor laser to output the light at any one of a plurality of wavelengths in a visible spectrum.

19. The fiber lighting system of claim 15, wherein the at least one light diffusing fiber comprises a first end optically coupled to a first output of the plurality of outputs and a second end optically coupled to a second output of the plurality of outputs.

20. The fiber lighting system of claim 19, wherein the non-transitory, processor-readable storage medium further comprises processor readable and executable instructions that, when executed, cause the processing device to:
  direct the micro electromechanical mirror to switch between a first coupled orientation that directs the light to the first output and a second coupled orientation that directs the light to the second output such that the semiconductor laser source illuminates the first end and the second end of the at least one light diffusing fiber.

* * * * *